(12) United States Patent
Cheng (10) Patent No.: US 8,777,541 B2
(45) Date of Patent: Jul. 15, 2014

(54) CONVEYOR CONTROL APPARATUS OF LIQUID CRYSTAL PANEL SUBSTRATES AND CONTROL METHOD THEREOF

(75) Inventor: Wen-da Cheng, Shenzhen (CN)

(73) Assignee: Shenzhen China Star Optoelectronics Technology Co., Ltd., Shenzhen (CN)

( * ) Notice: Subject to any disclaimer, the term of this patent is extended or adjusted under 35 U.S.C. 154(b) by 195 days.

(21) Appl. No.: 13/498,972

(22) PCT Filed: Feb. 8, 2012

(86) PCT No.: PCT/CN2012/070953
§ 371 (c)(1),
(2), (4) Date: Mar. 29, 2012

(87) PCT Pub. No.: WO2013/116996
PCT Pub. Date: Aug. 15, 2013

(65) Prior Publication Data
US 2013/0199896 A1    Aug. 8, 2013

(30) Foreign Application Priority Data

Feb. 7, 2012   (CN) .......................... 2012 1 0026447

(51) Int. Cl.
*F16B 39/32*   (2006.01)

(52) U.S. Cl.
USPC .............. 414/331.11; 414/331.09; 198/346.2; 211/59.4; 312/319.8

(58) Field of Classification Search
USPC .......... 414/210, 211, 222.11, 331.09, 331.11; 211/59.2, 59.4; 198/346.2, 617, 620; 193/35 R; 312/301, 319.8, 349
See application file for complete search history.

(56) References Cited

U.S. PATENT DOCUMENTS

| | | | | |
|---|---|---|---|---|
| 4,932,828 A * | 6/1990 | Katae et al. | | 414/286 |
| 5,203,661 A * | 4/1993 | Tanita et al. | | 414/331.16 |
| 5,435,686 A * | 7/1995 | Canner | | 414/152 |
| 5,976,258 A * | 11/1999 | Kleiner | | 118/718 |
| 6,073,743 A * | 6/2000 | Mefford | | 193/35 R |
| 6,616,401 B2 * | 9/2003 | Nakamura et al. | | 414/811 |
| 7,014,415 B2 * | 3/2006 | Yoshizawa | | 414/797.5 |
| 7,311,488 B2 * | 12/2007 | Park | | 414/663 |
| 7,482,555 B2 * | 1/2009 | Liu et al. | | 219/390 |
| 7,568,281 B2 * | 8/2009 | Yoshizawa et al. | | 29/740 |
| 7,743,903 B2 * | 6/2010 | Nakanishi | | 198/346.2 |
| 7,775,756 B2 * | 8/2010 | Koike et al. | | 414/331.11 |
| 7,806,644 B2 * | 10/2010 | Yuyama et al. | | 414/331.06 |
| 7,837,424 B2 * | 11/2010 | Solomon | | 414/331.04 |
| 7,850,411 B2 * | 12/2010 | Solomon | | 414/277 |
| 8,025,473 B2 * | 9/2011 | Asakawa | | 414/221 |
| 8,172,063 B2 * | 5/2012 | Ho | | 193/35 R |
| 8,215,727 B2 * | 7/2012 | Barrall et al. | | 312/223.2 |
| 8,312,981 B2 * | 11/2012 | Franz | | 198/370.09 |
| 8,365,950 B2 * | 2/2013 | Yuyama et al. | | 221/123 |

* cited by examiner

*Primary Examiner* — Douglas Hess
(74) *Attorney, Agent, or Firm* — Mark M. Friedman (57) ABSTRACT

A conveyor control apparatus of liquid crystal panel substrates and a control method thereof is disclosed. The apparatus has multiple first side pillars and multiple second side pillars mounted opposite to the first side pillars. A movement control assembly is mounted outside the first side pillars and the second side pillars. The movement control assembly is used to move to a slot where the liquid crystal panel substrate is to move is inserted, and control the certain liquid crystal panel substrate inserted in the slot to move out from the conveyor control apparatus.

15 Claims, 5 Drawing Sheets

CONVEYOR CONTROL APPARATUS OF LIQUID CRYSTAL PANEL SUBSTRATES AND CONTROL METHOD THEREOF

FIELD OF THE INVENTION

The present invention relates to a field of manufacturing a liquid crystal display (LCD) panel, and more particularly to a conveyor control apparatus of liquid crystal panel substrates and a control method thereof.

BACKGROUND OF THE INVENTION

With the development of liquid crystal panel, great technological skills for manufacturing liquid crystal products are required.

During the conveyance process of liquid crystal panel substrates, take a TFT (thin-film transistor) glass as the substrate for an example, during conveyance, basically, the TFT glasses are conveyed through cassettes, wherein there are two types of cassette conveyance.

The first type of cassette conveyance is random cassette conveyance, which has the advantage of flexibility on selecting which TFT glass is to be conveyed, but has the disadvantage of having a limited number of TFT glasses for a period of conveyance that leads to low production efficiency.

The second type of cassette conveyance is sequential cassette conveyance, which has the advantage of being capable of conveying more TFT glasses, but cannot rapidly select the desired TFT glass to convey.

Figure 1A:
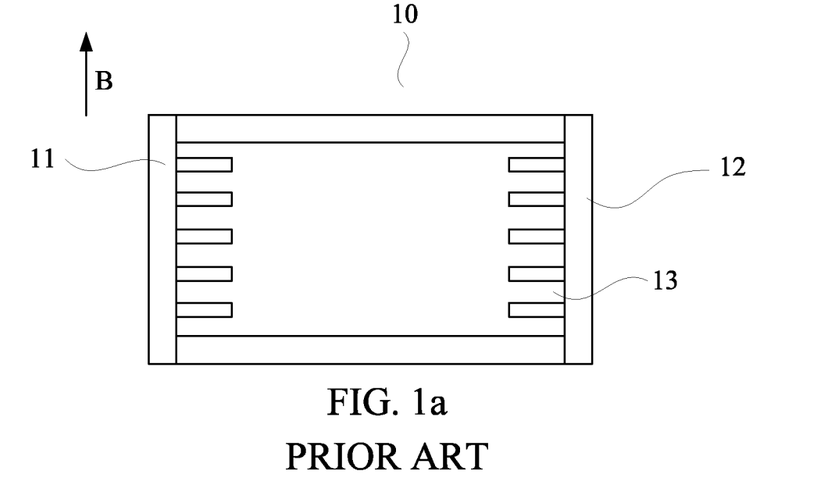
FIGS. 1a to 1c are schematic views of the structure of a cassette for conveying liquid crystal panel substrates according to a conventional technology.
Figure 1B:
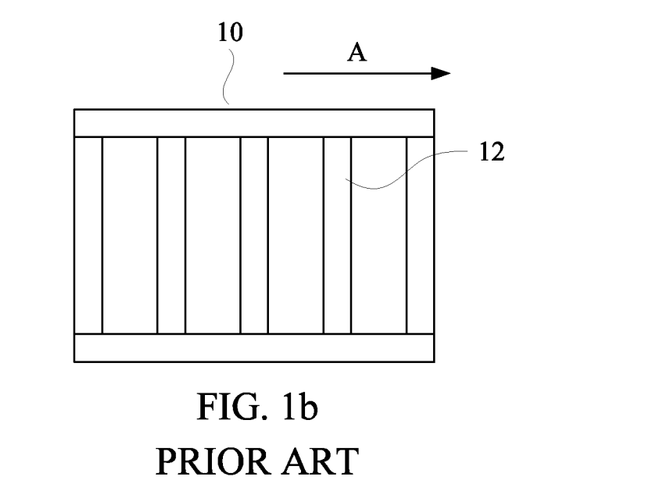
Figure 1C:
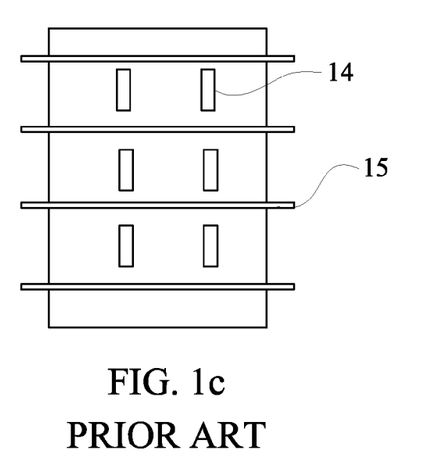

Since the type of sequential cassette conveyance has better efficiency, most conventional technologies adopt this type of conveyance to convey liquid crystal panel substrates. With reference to FIGS. 1a to 1c, FIGS. 1a to 1c are schematic views of cassette structures used for conveying liquid crystal panel substrates using the sequential cassette conveyance type, wherein FIG. 1a is a front view, FIG. 1b is a side view, FIG. 1c is a bottom view showing wheels and supporting ropes supporting a substrate, and FIG. 1d is a side view of FIG. 1c.

With reference to FIGS. 1a and 1b, a cassette 10 has multiple left side pillars 11 and multiple right side pillars 12, and the cassette 10 has multiple slots 13 formed therein. When conveying a liquid crystal panel substrate (as shown in FIG. 1c), the liquid crystal panel substrate, such as a TFT glass, is inserted in one of the slots 13. With reference to FIG. 1b, the substrate of liquid crystal moves in and out of the cassette 10 along a horizontal direction A.

Figure 1D:
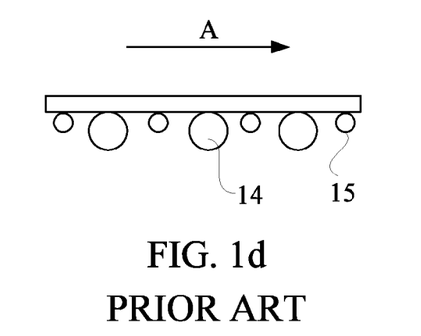
FIG. 1d is a side view of FIG. 1c.

With reference to FIGS. 1c and 1d, the cassette 10 has multiple wheels 14 mounted on a bottom thereof, and further has multiple supporting ropes 15 supporting the liquid crystal panel substrate.

In the process of conveying the liquid crystal panel substrates, once a certain one of the liquid crystal panel substrates is selected to be removed, the substrates under the selected substrate will have to be orderly removed from bottom to top via the rotation of the wheels 14, and after that the selected liquid crystal panel substrate then can be move out, and it takes a lot of time in such process.

Figure 2A:
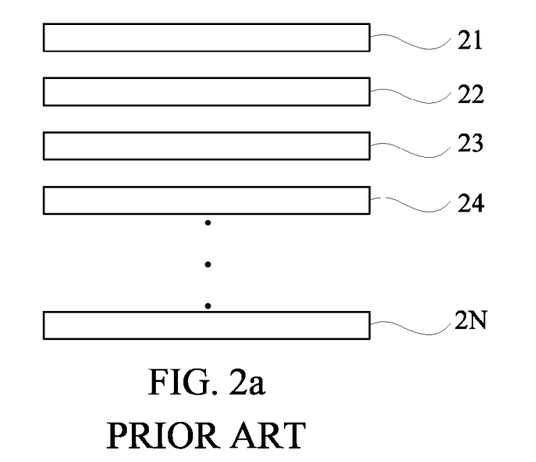
FIGS. 2a and 2b are schematic views showing a process of moving out the liquid crystal panel substrates from the apparatus shown in FIGS. 1a and 1b according to the conventional technology.
Figure 2B:
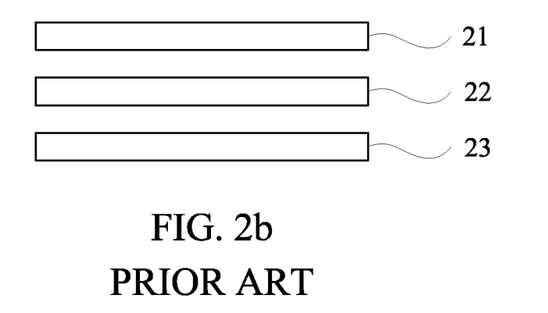

For example, with reference to FIGS. 2a and 2b, FIG. 2a is a side view of the liquid crystal panel substrates inserted and arranged in slots of the cassette, which include a first substrate 21, a second substrate 22, a third substrate 23, . . . , and a Nth substrate 2N. When the third substrate 23 is to be move out for inspection, substrates (24 to 2N) under the third substrate 23 will have to be moved out first, and then the third substrate 23 can be moved out. After inspecting the third substrate 23, the other substrates (24 to 2N) then will be inserted back to their original places. The process not only takes a lot of time, but also has low efficiency that limits the production capacity of liquid crystal panel.

In conclusion, time-consuming problem on moving out the liquid crystal panel substrates from the conveyor apparatus, which leads to low efficiency and limited production capacity of liquid crystal panel, has become one of the technical problems to be solved in the field of manufacturing liquid crystal products.

SUMMARY OF THE INVENTION

An object of the present invention is to provide a conveyor control apparatus of liquid crystal panel substrates to solve the time-consuming problem on moving out the liquid crystal panel substrates from the conventional conveyor apparatus, which leads to low efficiency and limited production capacity of liquid crystal panel.

In order to solve the aforementioned problem, the present invention provides a conveyor control apparatus of liquid crystal panel substrates, and the conveyor control apparatus comprises multiple first side pillars and multiple second side pillars mounted opposite to the first side pillars; an inner side of each of the first side pillars has multiple supporting posts protruding therefrom and an inner side of each of the second side pillars has multiple supporting posts protruding therefrom and being opposite to the corresponding supporting posts of the first side pillars; each two adjacent supporting posts of the same side pillar has a slot formed therebetween, and the liquid crystal panel substrates are inserted in the slots; the first side pillars are connected to the corresponding second side pillars through multiple supporting ropes; and the supporting ropes are used to support the liquid crystal panel substrates that are inserted in the slots;

a movement control assembly is mounted outside the first side pillars and the second side pillars, wherein the movement control assembly has multiple wheels, and each of the wheels has a ring side being center-concave shaped; and the movement control assembly is used to move to the slot where the liquid crystal panel substrate is to move is inserted, clamp the liquid crystal panel substrate inserted in the slot with the wheels of the movement control assembly and control the clamped liquid crystal panel substrate to move out from the conveyor control apparatus.

In the conveyor control apparatus of liquid crystal panel substrates of the present invention, the movement control assembly has multiple axle shafts and a retaining case, and the axle shafts are mounted in the retaining case; and each of the wheels has a through hole formed in a center thereof, and each of the wheel rotates around a corresponding one of the axle shafts.

In the conveyor control apparatus of liquid crystal panel substrates of the present invention, the movement control assembly further has a rotation controller, and the rotation controller is connected to the wheels; and the rotation controller is used to input a rotation signal to control the rotation of the wheels.

In the conveyor control apparatus of liquid crystal panel substrates of the present invention, a conjunction of the through hole of each of the wheels and each of the corresponding axle shaft has a spring mounted thereon; and when one of the wheel receives a horizontal force, the spring produces an elastic force to the wheel such that the wheel moves relative to the axle shaft.

In the conveyor control apparatus of liquid crystal panel substrates of the present invention, each of the supporting ropes has multiple disks mounted therethroguh, and a plane surface of each disk is perpendicular to a length direction of the supporting ropes; and while one of the liquid crystal panel substrates supported by the supporting ropes is moving, the substrate drives the disks on the ropes to rotate around the ropes.

In the conveyor control apparatus of liquid crystal panel substrates of the present invention, the wheels are made from elastic material.

In the conveyor control apparatus of liquid crystal panel substrates of the present invention, In the conveyor control apparatus of liquid crystal panel substrates of the present invention, the conveyor control apparatus of the liquid crystal panel substrates further comprises a lifting control assembly, and the lifting control assembly is connected to the movement control assembly and is used to control a lifting movement of the movement control assembly along a vertical direction.

Another object of the present invention is to provide a conveyor control apparatus of liquid crystal panel substrates, so as to solve the time-consuming problem on moving out the liquid crystal panel substrates from the conventional conveyor apparatus, which leads to low efficiency and limited production capacity of liquid crystal panel.

In order to solve the abovementioned problem, the present invention provides a conveyor control apparatus of liquid crystal panel substrates, and the conveyor control apparatus has multiple first side pillars and multiple second side pillars mounted opposite to the first side pillars; an inner side of each of the first side pillars has multiple supporting posts protruding therefrom and an inner side of each of the second side pillars has multiple supporting posts protruding therefrom and being opposite to the corresponding supporting posts of the first side pillars; each two adjacent supporting posts of the same side pillar have a slot formed therebetween, and the liquid crystal panel substrates are inserted in the slots; and a movement control assembly is mounted outside the first side pillars and the second side pillars; and the movement control assembly is used to move to the slot where the liquid crystal panel substrate is to move out is inserted and control the liquid crystal panel substrate inserted in the slot to move out from the conveyor control apparatus.

In the conveyor control apparatus of liquid crystal panel substrates of the present invention, the movement control assembly has multiple wheels, and each of the wheels has a ring side being center-concave shaped and is used to clamp the liquid crystal panel substrates.

In the conveyor control apparatus of liquid crystal panel substrates of the present invention, the movement control assembly has multiple axle shafts and a retaining case, and the axle shafts are mounted in the retaining case; and each of the wheels has a through hole formed in a center thereof, and each of the wheel rotates around a corresponding one of the axle shafts.

In the conveyor control apparatus of liquid crystal panel substrates of the present invention, the movement control assembly further has a rotation controller, and the rotation controller is connected to the wheels; and the rotation controller is used to input a rotation signal to control the rotation of the wheels.

In the conveyor control apparatus of liquid crystal panel substrates of the present invention, a conjunction of the through hole of each of the wheels and each of the corresponding axle shaft has a spring mounted thereon; and when one of the wheel receives a horizontal force, the spring produces an elastic force to the wheel such that the wheel moves relative to the axle shaft.

In the conveyor control apparatus of liquid crystal panel substrates of the present invention, the first side pillars are connected to the corresponding second side pillars through multiple supporting ropes; and the supporting ropes are used to support the liquid crystal panel substrates that are inserted in the slots.

In the conveyor control apparatus of liquid crystal panel substrates of the present invention, each of the supporting ropes has multiple disks mounted therethroguh, and a plane surface of each disk is perpendicular to a length direction of the supporting ropes; and while one of the liquid crystal panel substrates supported by the supporting ropes is moving, the substrate drives the disks on the ropes to rotate around the ropes.

In the conveyor control apparatus of liquid crystal panel substrates of the present invention, the wheels are made from elastic material.

In the conveyor control apparatus of liquid crystal panel substrates of the present invention, the conveyor control apparatus of the liquid crystal panel substrates further comprises a lifting control assembly, and the lifting control assembly is connected to the movement control assembly and is used to control a lifting movement of the movement control assembly along a vertical direction.

Still another object of the present invention is to provide a control method of a conveyor control apparatus of liquid crystal panel substrates, so as to solve the time-consuming problem on moving out the liquid crystal panel substrates from the conventional conveyor apparatus, which leads to low efficiency and limited production capacity of liquid crystal panel.

In order to solve the abovementioned problem, the present invention provides a control method of a conveyor control apparatus of liquid crystal panel substrates, the conveyor control apparatus has multiple first side pillars and multiple second side pillars mounted opposite to the first side pillars; an inner side of each of the first side pillars has multiple supporting posts protruding therefrom and an inner side of each of the second side pillars has multiple supporting posts protruding therefrom and being opposite to the corresponding supporting posts of the first side pillars; each two adjacent supporting posts of the same side pillar has a slot formed therebetween, and the liquid crystal panel substrates are inserted in the slots, and the control method comprises steps of:

mounting movement control assembly outside the first side pillars and the second side pillars;

controlling the movement control assembly to move to the slot where the liquid crystal panel substrate is to move out is inserted; and using the movement control assembly to control the liquid crystal panel substrate inserted in the slot to move out from the conveyor control apparatus.

Compared with the conventional technology, the present invention mounts movement control assembly outside the first side pillars and the second side pillars such that when a liquid crystal panel substrate is selected to be moved out, the movement control assembly is first moved in to a slot where the substrate is inserted, and then the liquid crystal panel substrate inserted in the slot is moved out from the conveyor control apparatus via the movement control assembly. The operation of the conveyor control apparatus takes a relatively short time and the process of the operation is simple and efficient and enormously enhances the production capacity of liquid crystal panel.

In order to make the contents of the present invention to be more easily understood, the preferred embodiments of the present invention are described in detail in cooperation with accompanying drawings as follows:

DETAILED DESCRIPTION OF THE PREFERRED EMBODIMENTS

Following description of each embodiment is referring to the accompanying drawings so as to illustrate practicable specific embodiments in accordance with the present invention.

Figure 3A:
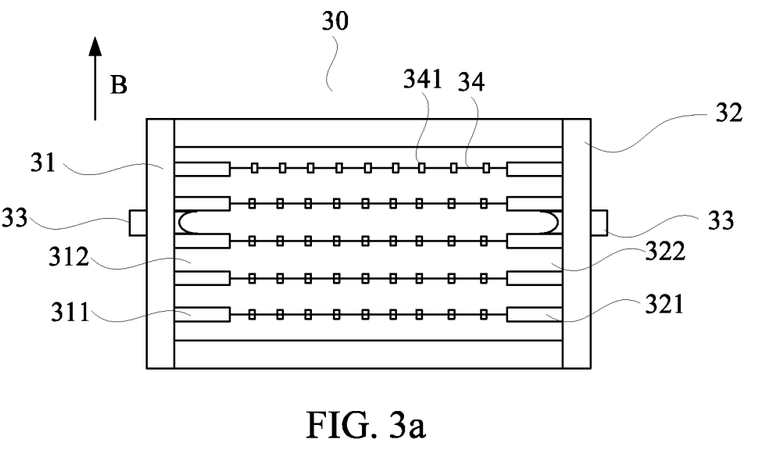
FIGS. 3a and 3b are schematic views of a preferred embodiment of a conveyor control apparatus of liquid crystal panel substrates in accordance with the present invention.
Figure 3B:
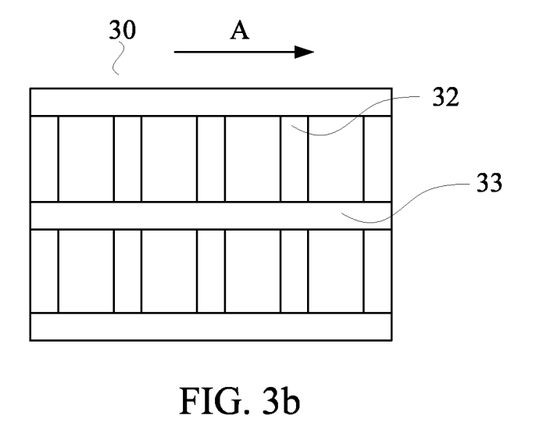

FIGS. 3a and 3b are schematic views of a preferred embodiment of a conveyor control apparatus of liquid crystal panel substrates in accordance with the present invention, wherein FIG. 3a is the front view and FIG. 3b is the side view.

With reference to FIG. 3a, a conveyor control apparatus 30 of liquid crystal panel substrates comprises multiple first side pillars 31 and multiple second side pillars 32. Each of the first side pillars 31 has an inner side and multiple first supporting posts 311 protruding from the inner side; each of the second side pillars 32 has an inner side and multiple second supporting posts 321 protruding from the inner side of the second side pillars 32. The adjacent first supporting posts 311 of the same first side pillar 31 form a first slot 312 therebetween, and the adjacent second supporting posts 321 form a second slot 322 therebetween. Two sides of a liquid crystal panel substrate (not shown in the figure) may be respectively inserted into one of the first slots 312 and one of the second slots 322, which are corresponding to each other, so as to be placed in the conveyor control apparatus 30.

With further reference to FIG. 3b, the conveyor control apparatus 30 of liquid crystal panel substrates further comprises a movement control assembly 33. The movement control assembly 33 is mounted outside the first side pillars 31 and the second side pillars 32. In this embodiment, the movement control assembly 33 is used to move to the slots (such as the first slot 312 and the second slot 322) where the liquid crystal panel substrate is to move out, and control the liquid crystal panel substrate inserted in the slots to move out from the slots along a horizontal direction "A".

In a specific implementation process, the conveyor control apparatus 30 of liquid crystal panel substrate may further comprise a lifting control assembly (not shown in the figure). The lifting control assembly is connected to the movement control assembly 33 and is used to control a lifting movement along a vertical direction "B" of the movement control assembly 33. Since an apparatus for controlling the lifting movement of a certain device is well-known common technical knowledge, therefore lifting control assembly will not be described in detail herein.

With reference to FIG. 3a, the first side pillars 31 and the corresponding second side pillars 32 may be connected to each other through multiple supporting ropes 34. The support ropes 34 are used to support the liquid crystal panel substrates (such as TFT glasses) that are inserted in the first slots 312 and the second slots 322.

Figure 4:
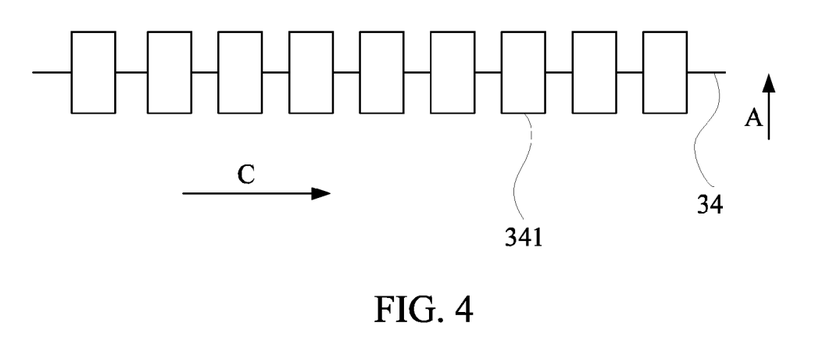
FIG. 4 is a schematic view of supporting ropes of the conveyor control apparatus of liquid crystal panel substrates in accordance with the present invention.

With further reference to FIG. 4, each of the supporting ropes 34 may further have multiple disks 341 mounted therethrough. A plane surface of each disk is perpendicular to a length direction "C" (direction A is perpendicular to direction C) of the supporting rope 34. As shown in FIG. 3a, the first supporting posts 311 and the second supporting posts 321 are mounted parallel with each other along the horizontal direction C, and the first slots 312 and the second slots 322 are parallel with each other along the horizontal direction C. While the liquid crystal panel substrate supported by the supporting ropes 34 is moving, it will drive the disks 341 on the supporting ropes 34 to rotate around the supporting ropes 34. And the resistance of the liquid crystal panel substrate moving out from the conveyor control apparatus can be reduced.

Figure 5A:
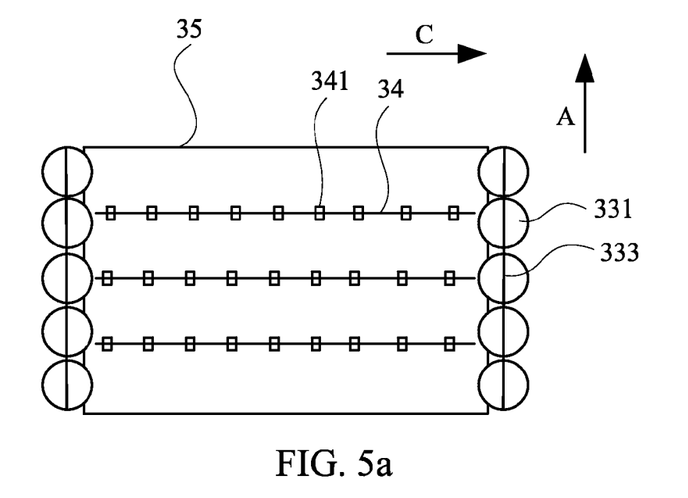
FIG. 5a is a top view showing a movement control assembly clamping a liquid crystal panel substrate according to the present invention.
Figure 5B:
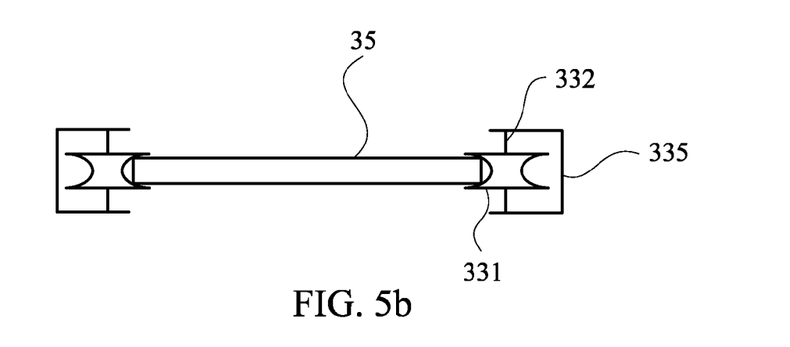
FIG. 5b is a front view showing the movement control assembly clamping the liquid crystal panel substrate according to the present invention.
Figure 5C:
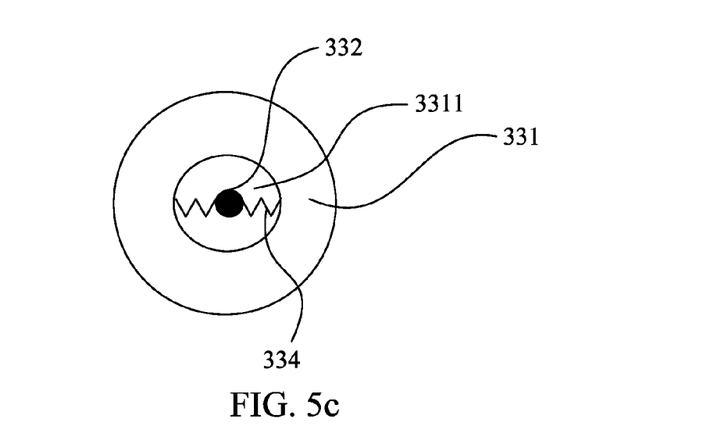
FIG. 5c is a schematic view of wheels of the movement control assembly according to the present invention.

To describe a preferred embodiment of the movement control assembly 33, please refer to FIGS. 5a to 5c. FIG. 5a is a top view showing the movement control assembly 33 clamping a liquid crystal panel substrate. FIG. 5b is a front view showing the movement control assembly 33 clamping the liquid crystal panel substrate. FIG. 5c is a schematic view of wheels of the movement control assembly 33.

The movement control assembly has multiple wheels 331, multiple axle shafts 332, multiple rotation controller 333, multiple springs 334 and multiple retaining cases 335. The wheels 331 are arranged in a line oriented the horizontal direction A. The axle shafts 332 extend along the vertical direction B and are parallel with the first side pillars 31 and the second side pillars 32. The wheels 331 each has a center and a through hole 3311 formed through the center (shown in FIG. 5c). The axle shafts 332 are mounted through the through holes 3311 of the wheels 331, respectively. The retaining cases 335 are used to fix the axle shafts 332. Each of the wheels 331 rotates around the corresponding shaft 332. Each of the wheels 331 has a ring side being center-concave shaped and is used to clamp one of the liquid crystal panel substrate 35.

The rotation controllers 333 each extends along the horizontal direction A and is connected to the wheels 331 arranged in the same line. The rotation controller 333 each is used to input a rotation signal to control the rotation of the wheels 331. The rotation controller 333 may be a metallic rod, or a rod made of any other material, which will not be listed here as long as the rod made of such material is able to control the rotation of the wheels 331.

The springs 334 each is mounted at a conjunction of the corresponding axle shaft 332 and the through holes 3311 of the corresponding wheel 331. When the wheel 331 receives a force along the direction C, the wheel can move relative to the axle shaft 332. Such means can prevent the liquid crystal panel substrate 35 from being damaged by the clamping of the wheels 331 at both sides.

Further, the wheels 331 may be made from elastic material, such as rubber. The elastic material can have the wheel 311 to be more resilient that can further prevent the liquid crystal panel substrate 35 from being damaged by the clamping of the wheels 331 at both sides.

The operation of the embodiment of the conveyor control apparatus of liquid crystal panel substrate according to the present invention is as follows:

With reference to FIGS. 3a to 5c, when conveying the liquid crystal panel substrates (such as TFT glasses), the liquid crystal panel substrates will be inserted into the first slots 312 and the second slots 322 of the conveyor control apparatus 30.

During conveying the liquid crystal panel substrates, once a certain one of the liquid crystal panel substrates is to be moved out, then the lifting control assembly is used to control the movement control assembly 33 to move along the vertical direction B to the first slot 312 and the second slot 322 where the liquid crystal panel substrate 33 is to move is inserted such that the wheels 331 of the movement control assembly 33 clamp the liquid crystal panel substrate.

After that, as shown in FIGS. 5a to 5c, the rotation controller 333 is used to input a rotation signal to control the wheels 331 to rotate around the corresponding axle shafts 332. With the rotation of the wheels 331, the liquid crystal panel substrate clamped by the wheels 331 then moves out from the conveyor control apparatus 30 along the horizontal direction A.

Since the supporting ropes 34 supporting the liquid crystal panel substrate have the disks 341 mounted therethrough, when the liquid crystal panel substrate supported by the supporting ropes 34 is moving, the substrate will drive the disks 341 on the supporting ropes 34 to rotate around the supporting ropes 34. Hence, the resistance of the liquid crystal panel substrate moving out from the conveyor control apparatus 30 can be reduced such that the liquid crystal panel substrate can smoothly move out.

In addition, since the wheels 331 are made from elastic material, and the conjunction of each of the axle shafts 332 and the through hole 3311 of each of the wheels 331 has a spring 334 mounted thereon, a problem that the liquid crystal panel substrate may be damaged by the overpressure of the wheels 331 can be avoided when the wheels 331 at both sides of the liquid crystal panel substrate clamp the liquid crystal panel substrate.

Figure 6:
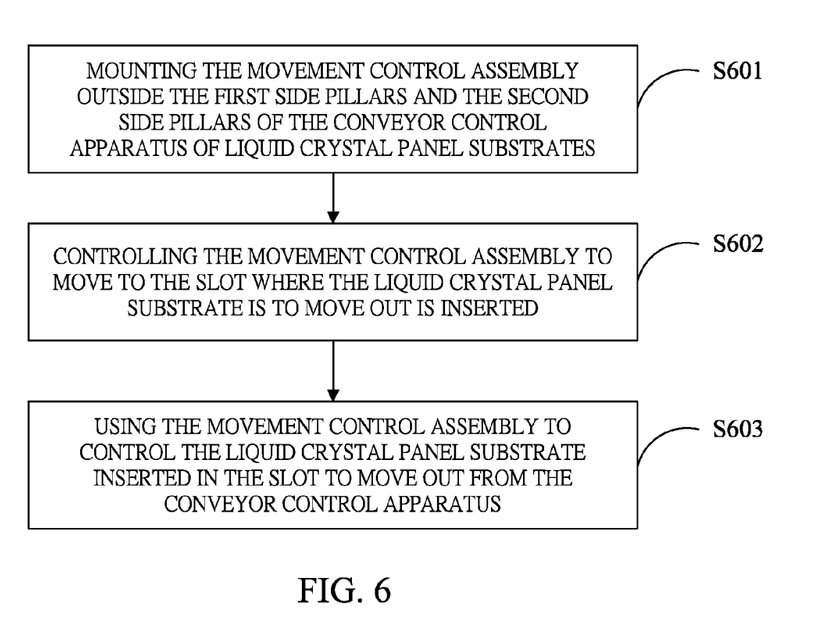
FIG. 6 is flow chart of a control method of the conveyor control apparatus of liquid crystal panel substrates.

FIG. 6 is a flow chart of a preferred embodiment of a control method of the conveyor control apparatus of the liquid crystal panel substrate according to the present invention.

In step S601, mount the movement control assembly outside the first side pillars and the second side pillars of the conveyor control apparatus of liquid crystal panel substrates.

The conveyor control apparatus of liquid crystal panel substrates herein has multiple first side pillars and multiple second side pillars mounted opposite to the first side pillars; each of the first side pillars has multiple supporting posts protruding from an inner side thereof and each of the second side pillars has an inner side and multiple supporting posts protruding from the inner side of the second side pillars and being opposite to corresponding supporting posts of the first side pillars; each two adjacent supporting posts of the same side pillar has a slot formed therebetween, and the liquid crystal panel substrates are inserted in the slots.

In step S602, control the movement control assembly to move to the slot where the liquid crystal panel substrate is to move out is inserted.

In step S603, use the movement control assembly to control the liquid crystal panel substrate inserted in the slot to move out from the conveyor control apparatus.

The detail description of the control method of the conveyor control apparatus of liquid crystal panel substrates can be seen in the above description about the operation of the conveyor control apparatus of liquid crystal panel substrates, and will not be repeated herein.

The present invention mounts movement control assembly outside the first side pillars and the second side pillars such that when a liquid crystal panel substrate is selected to be moved out, the movement control assembly is first moved to a slot where the substrate is inserted, and then the liquid crystal panel substrate inserted in the slot is moved out from the conveyor control apparatus by the movement control assembly. The operation of the conveyor control apparatus takes a relatively short time and the operation is simple and efficient and enormously enhances the production capacity of liquid crystal panel.

The present invention has been described with preferred embodiments thereof and it is understood that many changes and modifications to the described embodiments can be carried out without departing from the scope and the spirit of the invention that is intended to be limited only by the appended claims.

The invention claimed is:

1. A conveyor control apparatus of liquid crystal panel substrates comprising multiple first side pillars and multiple second side pillars mounted opposite to the first side pillars, wherein an inner side of each of the first side pillars has multiple supporting posts protruding therefrom and an inner side of each of the second side pillars has multiple supporting posts protruding therefrom and being opposite to the corresponding supporting posts of the first side pillars; each two adjacent supporting posts of the same side pillar has a slot formed therebetween, and the liquid crystal panel substrates are inserted in the slots; the first side pillars are connected to the corresponding second side pillars through multiple supporting ropes; and the supporting ropes are used to support the liquid crystal panel substrates that are inserted in the slots;

a movement control assembly is mounted outside the first side pillars and the second side pillars, wherein the movement control assembly has multiple wheels, and each of the wheels has a ring side being center-concave shaped; and the movement control assembly is used to move to the slot where the liquid crystal panel substrate is to move is inserted, clamp the liquid crystal panel substrate inserted in the slot with the wheels of the movement control assembly and control the clamped liquid crystal panel substrate to move out from the conveyor control apparatus.

2. The conveyor control apparatus of liquid crystal panel substrates as claimed in claim 1, wherein the movement control assembly has multiple axle shafts and a retaining case, and the axle shafts are mounted in the retaining case; and each of the wheels has a through hole formed in a center thereof, and each of the wheel rotates around a corresponding one of the axle shafts.

3. The conveyor control apparatus of liquid crystal panel substrates as claimed in claim 2, wherein a conjunction of the through hole of each of the wheels and each of the corresponding axle shaft has a spring mounted thereon; and when one of the wheel receives a horizontal force, the spring produces an elastic force to the wheel such that the wheel moves relative to the axle shaft.

4. The conveyor control apparatus of liquid crystal panel substrates as claimed in claim 1, wherein the movement control assembly further has a rotation controller, and the rotation controller is connected to the wheels; and the rotation controller is used to input a rotation signal to control the rotation of the wheels.

5. The conveyor control apparatus of liquid crystal panel substrates as claimed in claim 1, wherein each of the supporting ropes has multiple disks mounted therethroguh, and a plane surface of each disk is perpendicular to a length direction of the supporting ropes; and while one of the liquid crystal panel substrates supported by the supporting ropes is moving, the substrate drives the disks on the supporting ropes to rotate around the supporting ropes.

6. The conveyor control apparatus of liquid crystal panel substrates as claimed in claim 1, wherein the wheels are made from elastic material.

7. The conveyor control apparatus of liquid crystal panel substrates as claimed in claim 1, wherein the conveyor control apparatus of the liquid crystal panel substrates further comprises a lifting control assembly, and the lifting control assembly is connected to the movement control assembly and is used to control a lifting movement along a vertical direction of the movement control assembly.

8. A conveyor control apparatus of liquid crystal panel substrates comprising multiple first side pillars and multiple second side pillars mounted opposite to the first side pillars, wherein an inner side of each of the first side pillars has multiple supporting posts protruding therefrom and an inner side of each of the second side pillars has multiple supporting posts protruding therefrom and being opposite to the corresponding supporting posts of the first side pillars; each two adjacent supporting posts of the same side pillar have a slot formed therebetween, and the liquid crystal panel substrates are inserted in the slots; and a movement control assembly is mounted outside the first side pillars and the second side pillars; and the movement control assembly is used to move to the slot where the liquid crystal panel substrate is to move out is inserted and control the liquid crystal panel substrate inserted in the slot to move out from the conveyor control apparatus, wherein the movement control assembly has multiple wheels, and each of the wheels has a ring side being center-concave shaped and is used to clamp the liquid crystal panel substrates, and the wheels are made from elastic material.

9. The conveyor control apparatus of liquid crystal panel substrates as claimed in claim 8, wherein the conveyor control apparatus of the liquid crystal panel substrates further comprises a lifting control assembly, and the lifting control assembly is connected to the movement control assembly and is used to control a lifting movement of the movement control assembly along a vertical direction.

10. The conveyor control apparatus of liquid crystal panel substrates as claimed in claim 8, wherein the movement control assembly has multiple axle shafts and a retaining case, and the axle shafts are mounted in the retaining case; and each of the wheels has a through hole formed in a center thereof, and each of the wheel rotates around a corresponding one of the axle shafts.

11. The conveyor control apparatus of liquid crystal panel substrates as claimed in claim 10, wherein a conjunction of the through hole of each of the wheels and each of the corresponding axle shaft has a spring mounted thereon; and when one of the wheel receives a horizontal force, the spring produces an elastic force to the wheel such that the wheel moves relative to the axle shaft.

12. The conveyor control apparatus of liquid crystal panel substrates as claimed in claim 8, wherein the movement control assembly further has a rotation controller, and the rotation controller is connected to the wheels; and the rotation controller is used to input a rotation signal to control the rotation of the wheels.

13. The conveyor control apparatus of liquid crystal panel substrates as claimed in claim 8, wherein the first side pillars are connected to the corresponding second side pillars through multiple supporting ropes; and the supporting ropes are used to support the liquid crystal panel substrates that are inserted in the slots.

14. The conveyor control apparatus of liquid crystal panel substrates as claimed in claim 13, wherein each of the supporting ropes has multiple disks mounted therethroguh, and a plane surface of each disk is perpendicular to a length direction of the supporting ropes; and while one of the liquid crystal panel substrates supported by the supporting ropes is moving, the substrate drives the disks on the ropes to rotate around the ropes.

15. A control method of a conveyor control apparatus of liquid crystal panel substrates, wherein the conveyor control apparatus has multiple first side pillars and multiple second side pillars mounted opposite to the first side pillars; an inner side of each of the first side pillars has multiple supporting posts protruding therefrom and an inner side of each of the second side pillars has multiple supporting posts protruding therefrom and being opposite to the corresponding supporting posts of the first side pillars; each two adjacent supporting posts of the same side pillar has a slot formed therebetween, and the liquid crystal panel substrates are inserted in the slots, and the control method comprises steps of:

mounting a movement control assembly outside the first side pillars and the second side pillars, wherein the movement control assembly has multiple wheels, and each of the wheels has a ring side being center-concave shaped and is used to clamp the liquid crystal panel substrates;

controlling the movement control assembly to move to the slot where the liquid crystal panel substrate is to move out is inserted; and using the movement control assembly to control the liquid crystal panel substrate inserted in the slot to move out from the conveyor control apparatus.

\* \* \* \* \*